United States Patent
Maruyama et al.

(10) Patent No.: US 7,498,076 B2
(45) Date of Patent: Mar. 3, 2009

(54) METHODS FOR MANUFACTURING POROUS DIELECTRIC SUBSTRATES INCLUDING PATTERNED ELECTRODES

(75) Inventors: Masakatsu Maruyama, Kobe (JP); Yoshito Fukumoto, Kobe (JP); Chitaka Manabe, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 498 days.

(21) Appl. No.: 11/285,067

(22) Filed: Nov. 23, 2005

(65) Prior Publication Data
US 2006/0148209 A1 Jul. 6, 2006

(30) Foreign Application Priority Data
Jan. 5, 2005 (JP) .............................. 2005-000480

(51) Int. Cl.
- B32B 3/26 (2006.01)
- H01L 21/44 (2006.01)
- H01L 21/84 (2006.01)
- H05K 3/20 (2006.01)

(52) U.S. Cl. .................... 428/304.4; 438/458; 438/977

(58) Field of Classification Search ................ 438/455, 438/458, 459, 977, 409, 960; 428/304.4, 428/312.6
See application file for complete search history.

(56) References Cited

U.S. PATENT DOCUMENTS

| | | | | |
|---|---|---|---|---|
| 4,515,739 A | * | 5/1985 | Maine | 264/45.3 |
| 5,561,318 A | * | 10/1996 | Gnade et al. | 257/638 |
| 5,879,789 A | * | 3/1999 | Dolan et al. | 428/212 |
| 5,904,977 A | * | 5/1999 | Reitz | 428/304.4 |
| 6,030,694 A | * | 2/2000 | Dolan et al. | 428/212 |
| 6,511,758 B1 | * | 1/2003 | Kaitani | 428/550 |
| 6,562,744 B1 | * | 5/2003 | Nakanishi et al. | 501/39 |
| 7,166,531 B1 | * | 1/2007 | van den Hoek et al. | 438/623 |
| 2005/0181576 A1 | | 8/2005 | Ogawa et al. | |
| 2007/0077409 A1 | * | 4/2007 | Hirano et al. | 428/312.6 |

FOREIGN PATENT DOCUMENTS

| | | | |
|---|---|---|---|
| JP | 2001-055508 | | 7/2000 |
| JP | 2003-347291 | | 5/2002 |
| JP | 2005-170767 | * | 6/2005 |
| JP | 2006-190748 | * | 7/2006 |
| WO | WO 01/03776 A2 | | 1/2001 |

* cited by examiner

*Primary Examiner*—M. Wilczewski
(74) *Attorney, Agent, or Firm*—Reed Smith LLP; Juan Carlos A. Marquez, Esq.

(57) ABSTRACT

A method for manufacturing a porous dielectric substrate including patterned electrodes includes a patterned electrode-forming step of preparing a support plate having a releasable flat face and then forming the patterned electrodes on the flat face, a porous dielectric substrate-forming step of feeding a material for forming the porous dielectric substrate onto the flat face having the patterned electrodes arranged thereon to form the porous dielectric substrate in which the patterned electrodes are embedded, and a separation step of separating the support plate from the porous dielectric substrate having the patterned electrodes embedded therein. In the patterned electrode-forming step, the patterned electrodes formed on the flat face are processed to have rough surfaces in the patterned electrode-forming step. Alternatively, after the flat face is coated with a releasing agent, the patterned electrodes are formed on the resulting flat face.

3 Claims, 5 Drawing Sheets

METHODS FOR MANUFACTURING POROUS DIELECTRIC SUBSTRATES INCLUDING PATTERNED ELECTRODES

BACKGROUND OF THE INVENTION

1. Field of the Invention

The present invention relates to methods for manufacturing high-frequency circuit boards made of porous materials and particularly relates to methods for manufacturing porous dielectric substrates including patterned electrodes. Such porous dielectric substrates are useful in manufacturing microstrip circuit boards for high-frequency devices such as antennas and converters for microwaves and millimeter waves.

2. Description of the Related Art

An electronic circuit board including a dielectric substrate having patterned electrodes arranged thereon is usually manufactured by the following procedure: a conductive layer is provided on a dielectric substrate made of a glass fiber sheet impregnated with a fluorine resin and the patterned electrodes (patterned conductors) are then formed by pattering the conductive layer using a wiring pattern. The conductive layer is usually formed in such a manner that a piece of rolled or electrolytic copper foil is joined to the dielectric substrate by thermal fusion.

However, such a piece of copper foil cannot be joined to a ceramic substrate by thermal fusion. Therefore, a metal material is provided on the ceramic substrate by a paste-firing process (a printing process), a sputtering process, or a PVD process such as a vapor deposition process, whereby patterned electrodes are formed on the ceramic substrate. Since the use of these processes leads to an increase in manufacturing cost and a reduction in productivity, the following process has been recently used: a conductive layer is formed on a ceramic dielectric substrate by a direct wet plating process. In this process, the ceramic dielectric substrate is surface-treated depending on the composition of the ceramic dielectric substrate and the conductive layer is formed directly on the resulting ceramic dielectric substrate by electroless plating. The conductive layer on the ceramic dielectric substrate is patterned by a known process, whereby the patterned electrodes are formed.

In recent years, in order to reduce the dielectric loss of feeder lines, a material with low dielectric loss has been used to manufacture circuit boards for high-frequency circuit devices, such as antennas and converters for microwaves and millimeter waves, including microstrip circuits. Examples of such a material include a porous dielectric material, such as porous silica, having high porosity. However, there is a problem in that cracks are formed in the dielectric material during the fusion of the copper foil piece. Therefore, on an industrial scale, a conductive layer is formed on the dielectric material by the direct wet plating process.

On the other hand, in order to prepare the porous dielectric material at low temperature without using a firing process, the following procedure is used: a skeletal component such as alkoxysilane and a pore-forming component such as a surfactant are mixed with water, whereby an aerogel solution containing the skeletal component hydrolyzed and the pore-forming component is prepared; the solution is applied onto a support plate and the resulting support plate is dried, whereby a primary formed body is formed on the support plate; and the pore-forming component is then extracted from the primary formed body using a supercritical fluid. Alternatively, the following procedure is used: a primary formed body is formed on a base member using a xerogel solution and a solvent contained in this solution is removed from the primary formed body by drying.

However, if the conductive layer is formed on the porous dielectric material by the direct wet plating process, problems below arise and a satisfactory high-frequency circuit board cannot therefore be prepared.

(1) Change in dielectric properties due to high water absorption

Since the porous dielectric material has high porosity and therefore has high water absorption, a plating solution penetrates the material if a wet process is used; hence, the dielectric constant and dielectric loss of the material are varied, that is, the material cannot have properties suitable for high-frequency circuits even if the material is dried.

(2) Diffusion of conductive material for forming patterned electrodes

There is a problem in that a conductive material is diffused into the dielectric material during the formation of the conductive layer by a plating or sputtering process and this causes a deterioration in the flatness of the interface between the dielectric material and the conductive layer, resulting in a deterioration in the accuracy of an electrode pattern.

SUMMARY OF THE INVENTION

The present invention has been made to solve the above problems. It is an object of the present invention to provide methods for manufacturing porous dielectric substrates including flat patterned electrodes without deteriorating properties of the substrates.

A method for manufacturing a porous dielectric substrate including patterned electrodes according to the present invention includes a patterned electrode-forming step of preparing a support plate having a releasable flat face and then forming the patterned electrodes on the flat face, a porous dielectric substrate-forming step of feeding a material for forming the porous dielectric substrate onto the flat face having the patterned electrodes arranged thereon to form the porous dielectric substrate in which the patterned electrodes are embedded, and a separation step of separating the support plate from the porous dielectric substrate having the patterned electrodes embedded therein.

In a known method, a porous dielectric substrate is prepared and a conductive layer is formed on this porous dielectric substrate and then processed into patterned electrodes; hence, this porous dielectric substrate is damaged during the formation of this conductive layer. However, according to the method of the present invention, those patterned electrodes are formed on the releasable flat face of that support plate, that porous dielectric substrate in which those patterned electrodes are embedded is formed, and that support plate is then separated from that porous dielectric substrate; hence, the formation of that patterned electrodes hardly causes damage to that porous dielectric substrate, that is, intrinsic properties of that porous dielectric substrate are not deteriorated. Therefore, that porous dielectric substrate having those patterned electrodes with high flatness can be readily manufactured.

In the patterned electrode-forming step, those patterned electrodes formed on the flat face are preferably processed to have rough surfaces. This leads to an increase in adhesion between those patterned electrodes and that porous dielectric substrate. Alternatively, after the flat face is coated with a releasing agent, those patterned electrodes are preferably formed on the resulting flat face.

A method for manufacturing a porous dielectric substrate including patterned electrodes according to the present invention includes a patterned electrode-forming step of preparing a support plate having a releasable flat face, providing a net sheet on the flat face, and then forming the patterned electrodes on the net sheet; a primary formed body-drying step of feeding a solution, containing a skeletal component and a pore-forming component, for forming the porous dielectric substrate onto the net sheet having the patterned electrodes arranged thereon to form a primary formed body in which the patterned electrodes are embedded and then drying the primary formed body; a primary formed body-separating step of separating the dried primary formed body and the net sheet from the support plate; a porous dielectric substrate-forming step of extracting the pore-forming component from the primary formed body joined to the net sheet to form the porous dielectric substrate in which the patterned electrodes are embedded; and a separation step of separating the net sheet from the porous dielectric substrate joined to the net sheet.

According to this method, the formation of the patterned electrodes hardly causes damage to the porous dielectric substrate, that is, intrinsic properties of the porous dielectric substrate are not deteriorated. Therefore, the porous dielectric substrate having the patterned electrodes with high flatness can be readily manufactured. Since the primary formed body is separated from the support plate and the pore-forming component is then extracted and removed from the primary formed body joined to the net sheet with, for example, a supercritical fluid when the porous dielectric substrate is formed from the solution (an aerogel solution), the efficiency of extracting the pore-forming component is high; hence, the porous dielectric substrate can be readily manufactured.

A method for manufacturing a porous dielectric substrate including patterned electrodes according to the present invention includes a preparation step of preparing a support plate having the patterned electrodes arranged thereon and a conductive sheet-porous dielectric substrate composite plate including a conductive sheet and the porous dielectric substrate joined thereto, a joining step of joining the porous dielectric substrate to a flat face of the support plate such that the patterned electrodes adhere to the porous dielectric substrate, and a separation step of separating the support plate from the porous dielectric substrate having the patterned electrodes adhering thereto. In this method, the support plate may include a net.

According to this method, the formation of the patterned electrodes hardly causes damage to the porous dielectric substrate, that is, intrinsic properties of the porous dielectric substrate are not deteriorated. Therefore, the porous dielectric substrate having the patterned electrodes and the conductive sheet can be readily manufactured. The patterned electrodes are arranged on a face of the porous dielectric substrate and have high flatness. The conductive sheet is placed on another face of the porous dielectric substrate and can serve as a support member or a grounding conductor.

A method for manufacturing a porous dielectric substrate including patterned electrodes according to the present invention includes a preparation step of preparing a net sheet having the patterned electrodes arranged thereon and a primary formed body formed from a solution, containing a skeletal component and a pore-forming component, for forming the porous dielectric substrate; a joining step of joining the net sheet to the primary formed body such that the patterned electrodes adhere to the primary formed body; a porous dielectric substrate-forming step of drying the primary formed body joined to the net sheet and then extracting the pore-forming component from the primary formed body to form the porous dielectric substrate joined to the patterned electrodes and the net sheet; and a separation step of separating the net sheet from the porous dielectric substrate.

According to this method, the formation of the patterned electrodes hardly causes damage to the porous dielectric substrate, that is, intrinsic properties of the porous dielectric substrate are not deteriorated. Therefore, the porous dielectric substrate having the patterned electrodes with high flatness can be readily manufactured. Since the pore-forming component is extracted and removed from the dried primary formed body in such a manner that the patterned electrodes are joined to the net sheet, the displacement and/or removal of the patterned electrodes can be prevented. The conductive sheet placed on a face of the porous dielectric substrate can serve as a support member or a grounding conductor.

A method for manufacturing a porous dielectric substrate including patterned electrodes according to the present invention includes a patterned electrode-forming step of preparing two support plates each having corresponding releasable flat faces and then forming the patterned electrodes on the flat faces, a spacing step of spacing the two support plates apart from each other such that the flat faces having the patterned electrodes thereon are opposed to each other, a porous dielectric substrate-forming step of packing a material for forming the porous dielectric substrate between the spaced support plates to form the porous dielectric substrate in which the patterned electrodes are embedded, and a separation step of separating the support plates from the porous dielectric substrate having the patterned electrodes embedded therein.

According to this method, the formation of the patterned electrodes hardly causes damage to the porous dielectric substrate, that is, intrinsic properties of the porous dielectric substrate are not deteriorated. Therefore, the porous dielectric substrate having the patterned electrodes can be readily manufactured. The patterned electrodes are arranged on both faces of the porous dielectric substrate and have high flatness.

A method for manufacturing a porous dielectric substrate including patterned electrodes according to the present invention includes a patterned electrode-forming step of preparing a support plate having a releasable flat face and then the forming patterned electrodes on the flat face, a preparation step of preparing a conductive sheet-porous dielectric substrate composite plate including a conductive sheet and the porous dielectric substrate joined thereto, a joining step of joining the porous dielectric substrate to the flat face of the support plate such that the patterned electrodes adhere to the porous dielectric substrate, and a separation step of separating the support plate from the porous dielectric substrate having the patterned electrodes adhering thereto.

According to the present invention, patterned electrodes are formed on a releasable flat face of a support plate, a porous dielectric substrate in which the patterned electrodes are embedded is formed, and the support plate is then separated from the porous dielectric substrate; hence, the formation of the patterned electrodes hardly causes damage to the porous dielectric substrate, that is, intrinsic properties of the porous dielectric substrate are not deteriorated. Therefore, the porous dielectric substrate having the patterned electrodes with high flatness can be readily manufactured. In the present invention, since a wet plating process is not used, the following problems can be prevented: a problem that properties of the porous dielectric substrate are varied because the porous dielectric substrate absorbs a plating solution and a problem that the flatness and accuracy of the patterned electrodes are deteriorated because a material for forming the patterned electrodes is diffused in the porous dielectric substrate. Thus, the porous dielectric substrate has high quality.

DESCRIPTION OF THE PREFERRED EMBODIMENTS

Methods for manufacturing porous dielectric substrates including patterned electrodes according to embodiments of the present invention will now be described with reference to the accompanying drawings.

First Embodiment

Figure 1A:
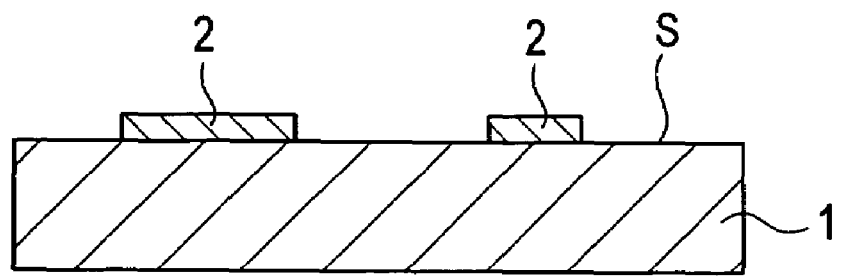
FIGS. 1A to 1C are sectional views illustrating steps included in a method for manufacturing a porous dielectric substrate according to a first embodiment of the present invention.
Figure 1B:
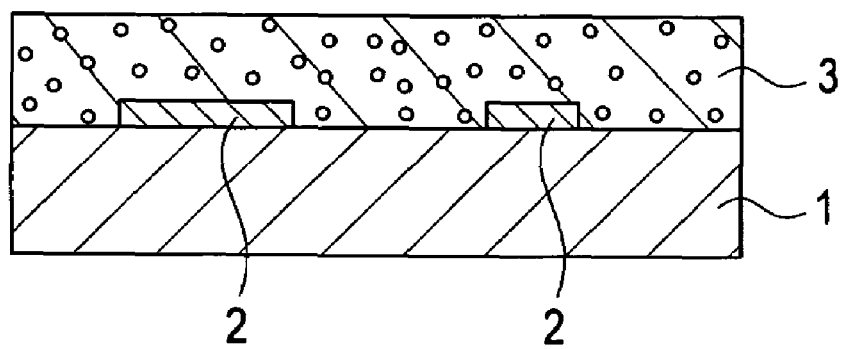
Figure 1C:
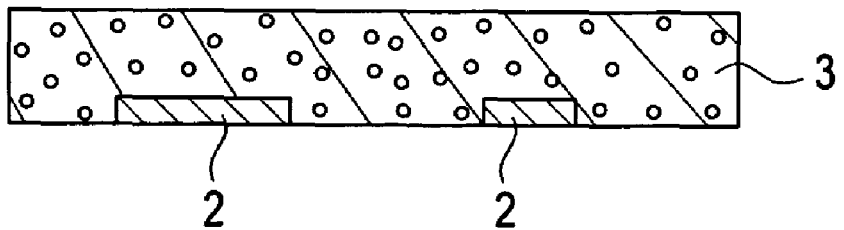

FIGS. 1A to 1C are sectional views illustrating steps included in a method for manufacturing a porous dielectric substrate according to a first embodiment of the present invention. As shown in FIG. 1A, a support plate 1 having a releasable flat face S (the upper face in this figure) is prepared and patterned electrodes 2 are formed on the flat face S of the support plate 1. This step is referred to as a patterned electrode-forming step.

Preferable examples of a material for forming the support plate 1 include fluorine resins such as polytetrafluoroethylene (Teflon®), which is hydrophobic and oleophobic and has good releasability. In order to enhance the releasability, a releasing agent such as fluorocarbon oil having good releasability may be applied onto the flat face S before the porous dielectric substrate is prepared. The support plate 1 need not be entirely coated with such fluorocarbon oil. Alternatively, the following plate may be used: a base plate, made of metal or synthetic resin, having a flat face coated with the fluorocarbon oil.

The patterned electrodes 2 may be formed on the flat face S by an ordinary patterning process. In particular, if an etching process such as a photolithographic process is used, the patterned electrodes 2 can be accurately formed. The patterned electrodes 2 are arranged on the flat face S such that the patterned electrodes 2 are arranged in a desired pattern when viewed from the flat face S.

After the patterned electrodes 2 are formed on the flat face S, the patterned electrodes 2 are preferably etched with a solution of ferric chloride so as to have rough surfaces. This leads to an increase in the adhesion between the patterned electrodes 2 and the porous dielectric substrate and an increase in the peel resistance of the patterned electrodes 2. If the porous dielectric substrate is used to prepare a high-frequency circuit board, the patterned electrodes 2 preferably have a surface roughness sufficiently less than the frequency used in the high-frequency circuit. When a frequency of 60 MHz is used, the patterned electrodes 2 preferably have a surface roughness of several thousand angstroms.

Figure 2:
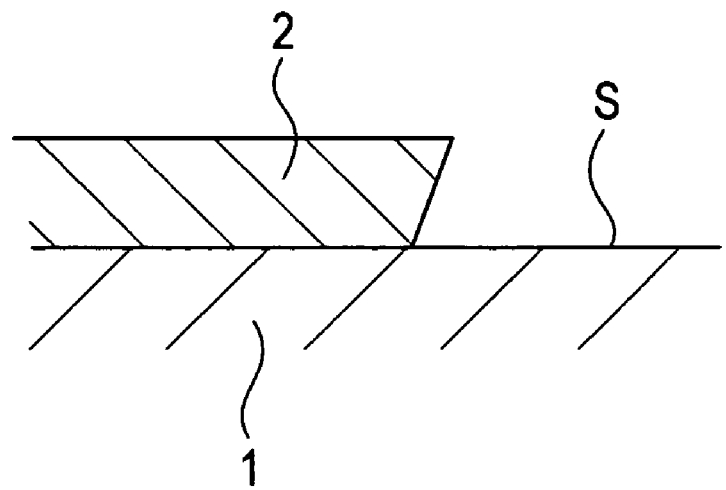
FIG. 2 is an enlarged sectional view showing an end portion of a patterned electrode.

Etching conditions are preferably adjusted such that the patterned electrodes 2 are tapered in cross section toward the flat face S as shown in FIG. 2, that is, the patterned electrodes 2 preferably have an undercut shape in cross section. Since the patterned electrodes 2 are embedded in a surface portion of the porous dielectric substrate as described below, the patterned electrodes 2 can be securely retained in the porous dielectric substrate because of such an undercut shape.

As shown in FIG. 1B, a material for forming the porous dielectric substrate is fed onto the flat face S of the support plate 1 on which the patterned electrodes 2 are arranged, whereby the porous dielectric substrate which is represented by reference numeral 3 and in which the patterned electrodes 2 are embedded is formed. This step is referred to as a porous dielectric substrate-forming step.

Examples of the porous dielectric substrate-forming material include a xerogel solution and an aerogel solution (a porous dielectric substrate-forming solution). The xerogel solution can be formed into porous dielectric bodies by removing an organic solvent such as alcohol therefrom. The aerogel solution can be prepared in such a manner that a skeletal component such as metal alkoxide including tetramethoxysilane (TMOS) and a pore-forming component such as a surfactant including trimethylammonium cetylate are mixed with water and/or alcohol and the mixture is then agitated such that the skeletal component is hydrolyzed. The aerogel or xerogel solution is applied onto the flat face S of the support plate 1 by a spin coating process or a roll coating process and the support plate 1 is then dried, whereby a primary formed body is prepared. When the xerogel solution is used, the porous dielectric substrate 3 can be prepared by removing an organic solvent such as alcohol from the primary formed body. When the aerogel solution is used, the porous dielectric substrate 3 can be prepared in such a manner that the primary formed body is dried and then subjected to supercritical extraction together with the support plate 1 such that the pore-forming component is extracted and removed from the primary formed body with a supercritical fluid.

As shown in FIG. 1C, the support plate 1 is separated from the porous dielectric substrate 3 joined thereto, whereby the porous dielectric substrate 3 having the patterned electrodes 2 embedded therein can be obtained. This step is referred to as a separation step. Since the flat face S of the support plate 1 has good releasability and/or is coated with the releasing agent, the porous dielectric substrate 3 can be readily separated from the support plate 1 in such a manner that the porous dielectric substrate 3 retains the patterned electrodes 2.

In this embodiment, when the porous dielectric substrate-forming material is the aerogel solution, the primary formed body is subjected to supercritical extraction in such a manner that the primary formed body is retained on the support plate 1, whereby the pore-forming component is removed from the primary formed body. In this operation, the pore-forming component is extracted from exposed faces of the primary formed body with a supercritical fluid. The extraction efficiency can be increased in such a manner that the pore-forming component is supercritically extracted from a face of the primary formed body that is in contact with the support plate 1.

This manner is as described below. A net sheet is provided on the flat face S of the support plate 1 and the patterned electrodes 2 are formed on the net sheet. The aerogel solution containing the skeletal component and the pore-forming component is fed onto the net sheet having the patterned electrodes 2 arranged thereon, whereby the primary formed body in which the patterned electrodes 2 are embedded is obtained. The primary formed body is dried. The primary formed body and the net sheet are separated from the support plate 1. The primary formed body joined to the net sheet, which functions as a support, is subjected to supercritical extraction. Since the pore-forming component is removed from the primary formed body, the porous dielectric substrate 3 in which the patterned electrodes 2 are embedded is obtained. The net sheet is then separated from the porous dielectric substrate 1.

It is preferable that the net sheet be insoluble in the supercritical fluid and have openings through which the supercritical fluid passes. Examples of the net sheet include a sheet of glass fiber cloth and a stainless steel net. If the net sheet is coated with a releasing agent such as fluorocarbon oil, the net sheet can be readily separated from the porous dielectric substrate. If the patterned electrodes 2 are processed to have rough surfaces as described above, the patterned electrodes 2 can be securely joined to the porous dielectric substrate.

Figure 3:
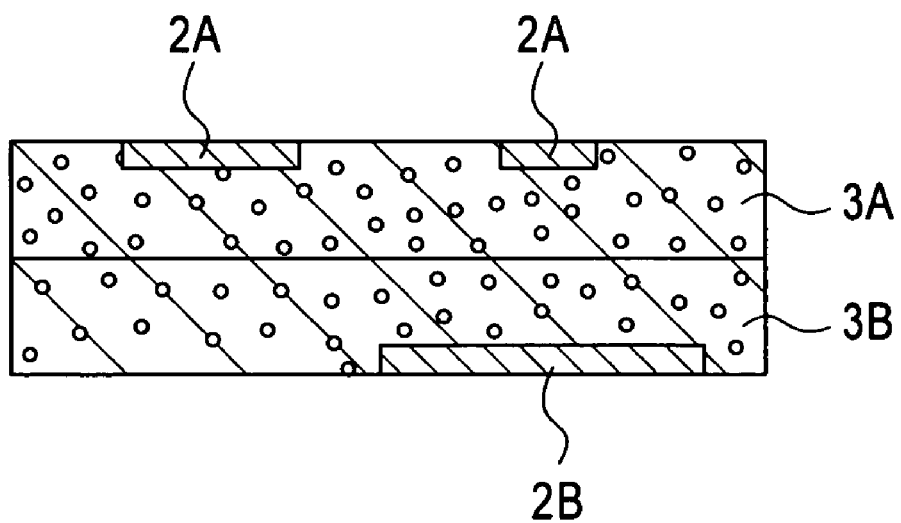
FIG. 3 is a sectional view of a porous dielectric substrate having patterned electrodes arranged on the front and rear faces thereof.

A porous dielectric substrate for forming a high-frequency circuit board may have patterned electrodes arranged on the front and rear faces thereof. FIG. 3 shows this porous dielectric substrate. This porous dielectric substrate can be readily manufactured as described below. The following sheets are prepared: a first porous dielectric sheet 3A having first patterned electrodes 2A arranged on the front face thereof in a predetermined wiring pattern and a second porous dielectric sheet 3B having second patterned electrodes 2B arranged on the rear face thereof in a predetermined wiring pattern. The first and second porous dielectric sheets 3A and 3B are joined to each other such that the first and second patterned electrodes 2A and 2B are exposed, whereby this porous dielectric substrate is obtained.

Second Embodiment

A porous dielectric substrate for manufacturing a high-frequency circuit board may have a conductive sheet, placed on a face thereof, serving as grounding conductor and patterned electrodes placed on another face thereof. A method for manufacturing such a porous dielectric substrate according to a second embodiment of the present invention will now be described with reference to FIGS. 4A to 4D.

Figure 4A:
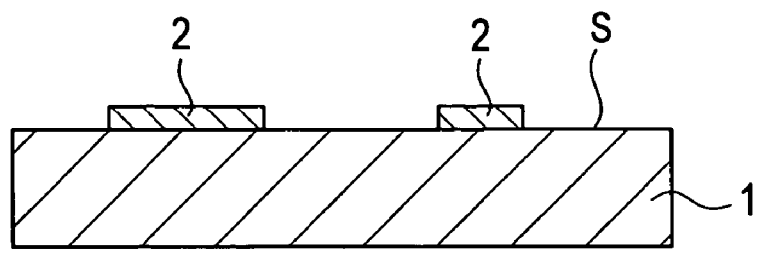
FIGS. 4A to 4D are sectional views illustrating steps included in a method for manufacturing a porous dielectric substrate according to a second embodiment of the present invention.
Figure 4B:
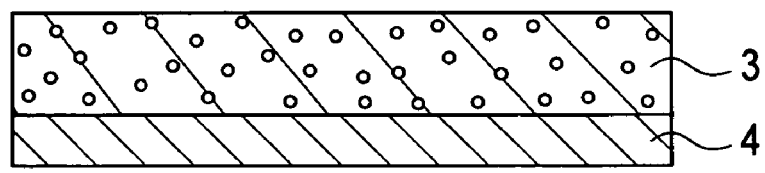
Figure 4C:
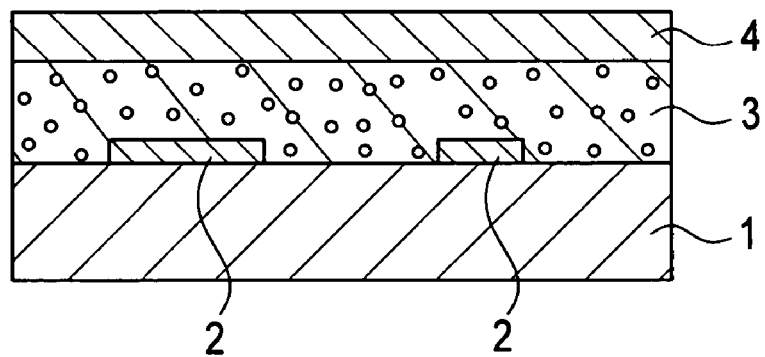
Figure 4D:
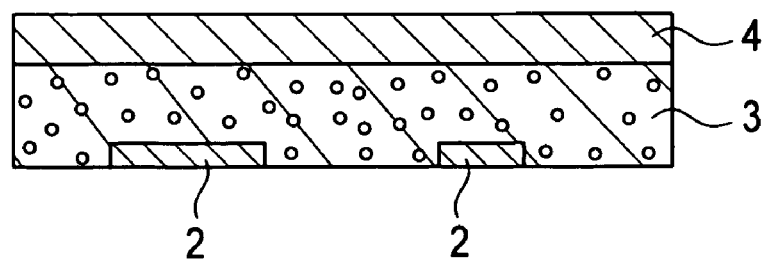
Figure 5A:
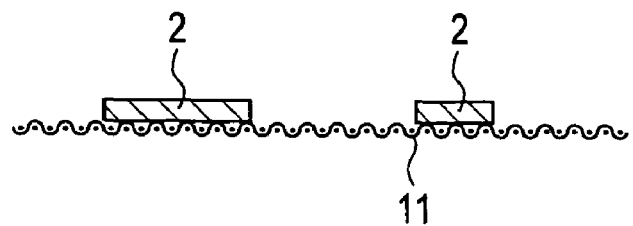
FIGS. 5A to 5D are sectional views illustrating steps included in a variation of the method according to the second embodiment.
Figure 5B:
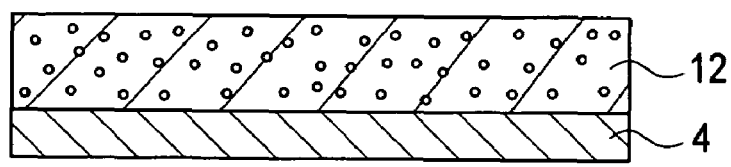
Figure 5C:
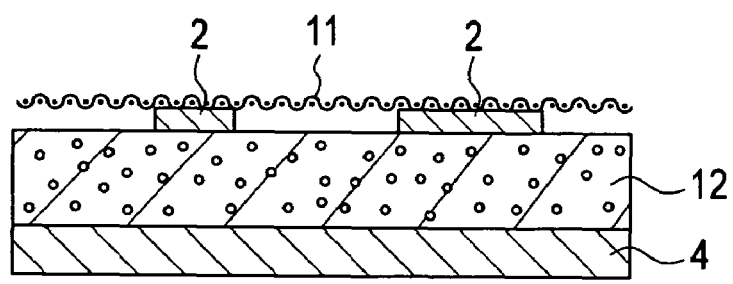
Figure 5D:
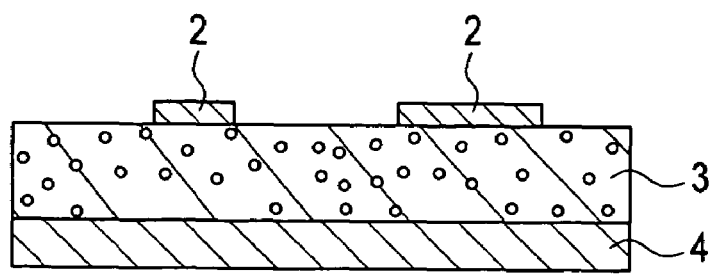

As shown in FIG. 4A, a support plate 1 is prepared. The support plate 1 has a flat face S and patterned electrodes 2, arranged on the flat face S, formed in a step identical to the patterned electrode-forming step described above. As shown in FIG. 4B, a conductive sheet-porous dielectric substrate composite plate is prepared. The conductive sheet-porous dielectric substrate composite plate includes a conductive sheet 4 made of aluminum or copper and a porous dielectric substrate 3 formed in a step identical to the porous dielectric substrate-forming step described above. As shown in FIG. 4C, the porous dielectric substrate 3 is joined to the flat face S of the support plate 1 such that the patterned electrodes 2 are embedded in a surface portion of the porous dielectric substrate 3. The porous dielectric substrate 3 is then separated from the support plate 1 such that the patterned electrodes 2 remain in the porous dielectric substrate 3. In order to allow the patterned electrodes 2 to remain in the porous dielectric substrate 3, the support plate 1 is moved in parallel to the flat face S, whereby the support plate 1 can be readily separated from the porous dielectric substrate 3.

In this embodiment, the patterned electrodes 2 are completely embedded in the surface portion of the porous dielectric substrate 3. However, the patterned electrodes 2 need not be completely embedded in the porous dielectric substrate 3 and may be joined to the porous dielectric substrate 3. If the patterned electrodes 2 are not completely embedded in the porous dielectric substrate 3, it is difficult to separate the patterned electrodes 2 from the support plate 1. In this case, the patterned electrodes 2 can be separated from the support plate 1 by the following procedure: a thermally releasable material (for example, a volatile material having a melting point less than that of a material for forming the patterned electrodes 2) is sandwiched between the support plate 1 and patterned electrodes 2, the porous dielectric substrate 3 is joined to the patterned electrodes 2, and the support plate 1 is then heated. Furthermore, in this embodiment, the support plate 1 is solid and has neither openings nor channels. The support plate 1 may include a net, for example, a net sheet identical to that described above. In this case, the patterned electrodes 2 may be arranged on this net sheet placed on the support plate 1. The patterned electrodes 2 may be formed on this net sheet by a sputtering process or by providing pieces of copper foil on this net sheet.

A variation of the method according to the second embodiment of the present invention will now be described with reference to FIG. 5. The variation is useful in manufacturing a porous dielectric substrate using an aerogel solution.

A net sheet 11 having patterned electrodes 2 is prepared. A primary formed body 12 is formed using a porous dielectric substrate-forming solution containing a skeletal component and a pore-forming component. The primary formed body 12 is provided on a conductive sheet 4. The patterned electrodes 2 are arranged on the net sheet 11, which is placed on a flat face of a support plate 1. Before the primary formed body 12 is dried, the primary formed body 12 is joined to the net sheet 11 such that the patterned electrodes 2 adhere to the primary formed body 12. The resulting primary formed body 12 is dried. The primary formed body 12 joined to the net sheet 11 is subjected to supercritical extraction, whereby the pore-forming component is removed from the primary formed body 12. This leads to the formation of a porous dielectric substrate 3 having the patterned electrodes 2 arranged thereon. Since the net sheet 11 is placed between the support plate 1 and the patterned electrodes 2, the displacement and/or removal of the patterned electrodes 2 can be prevented during the supercritical extraction. Therefore, a composite board can be readily prepared according to design. After the supercritical extraction is performed, the net sheet 11 is separated from the porous dielectric substrate 3 and the patterned electrodes 2, whereby the porous dielectric substrate 3 having the patterned electrodes 2 and the conductive sheet 4 is obtained.

Third Embodiment

A method for manufacturing a porous dielectric substrate according to a third embodiment of the present invention will now be described with reference to FIGS. 6A 6C. Although the porous dielectric substrate 3 shown in FIG. 3 is prepared by joining the first porous dielectric sheet 3A having the first patterned electrodes 2A to the second porous dielectric sheet 3B having the second patterned electrodes 2B, no sheets are joined to each other in this embodiment.

Figure 6A:
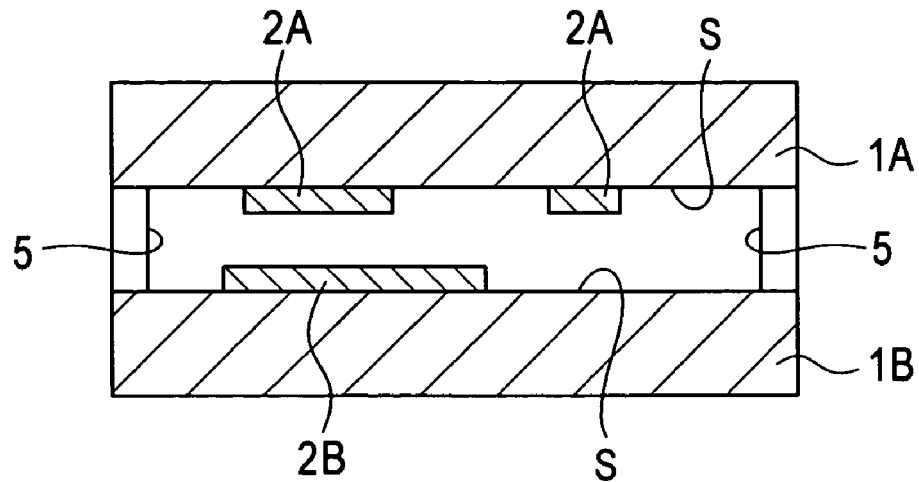
FIGS. 6A to 6C are sectional views illustrating steps included in a method for manufacturing a porous dielectric substrate according to a third embodiment of the present invention.

As shown in FIG. 6A, a first support plate 1A and a second support plate 1B are prepared. The first support plate 1A has a flat face S and has first patterned electrodes 2A arranged on the flat face S thereof. The second support plate 1B has a flat face S and has second patterned electrodes 2B arranged on the flat face S thereof. The first and second patterned electrodes 2A and 2B can be formed in a step identical to the patterned electrode-forming step.

The first and second support plates 1A and 1B are spaced from each other at a predetermined distance such that the flat face S of the first support plate 1A is opposed to the flat face S of the patterned electrodes 2. In order to maintain the distance therebetween, spacers 5 having releasable faces may be arranged between the flat faces S of the first and second support plates 1A and 1B. Various types of spacers can be used. For example, bar-shaped spacers having a rectangular shape in cross section may be arranged along end portions of the first and second support plates 1A and 1B. Alternatively, pillar-shaped spacers having a small length may be placed at the four corners of the first or second support plate 1A or 1B. The distance between the first and second support plates 1A and 1B may be varied depending on the type of a board to be manufactured. If a high-frequency circuit board is manufactured, the distance therebetween is usually set to 1 mm or less.

Figure 6B:
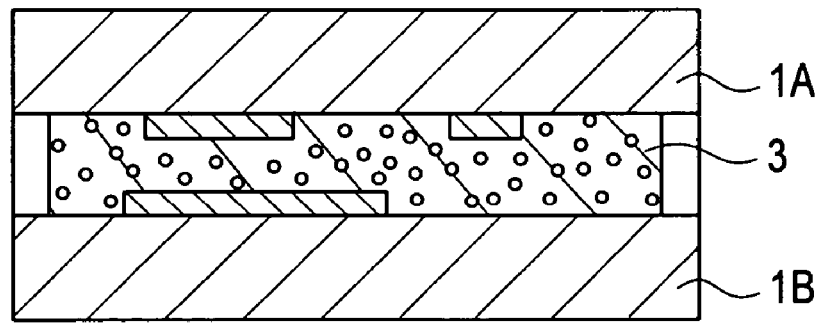

As shown in FIG. 6B, a material for forming a porous dielectric substrate 3 is packed between the first and second support plates 1A and 1B spaced from each other, whereby the porous dielectric substrate 3 in which the first and second patterned electrodes 2A and 2B are embedded is formed. Since the porous dielectric substrate-forming material is gel and the distance therebetween is 1 mm or less, the material is retained between the first and second support plates 1A and 1B because of its surface tension, that is, the material can be packed between the first and second support plates 1A and 1B. The packed material is dried in such a manner that water or an organic solvent contained in the material is vaporized and then removed through side openings between the first and second support plates 1A and 1B. If the material is an aerogel solution, the packed material is dried and then subjected to supercritical extraction, whereby a pore-forming component is extracted. This leads to the formation of the porous dielectric substrate 3.

Figure 6C:
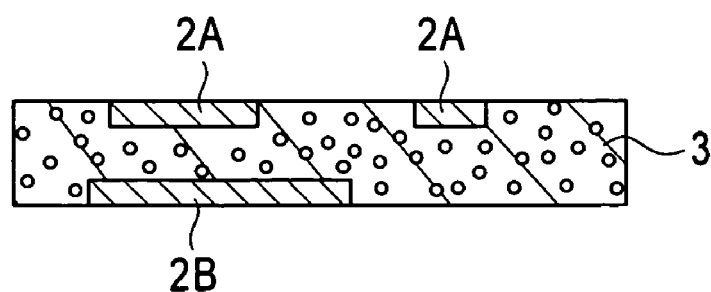

After the porous dielectric substrate 3 is formed, as shown in FIG. 6C, the first and second support plates 1A and 1B are separated from the porous dielectric substrate 3 having the first and second patterned electrodes 2A and 2B are embedded therein. Since the flat faces S of the first and second support plates 1A and 1B are releasable, the first and second support plates 1A and 1B can be readily removed from the porous dielectric substrate 3 in such a manner that the first and second patterned electrodes 2A and 2B are allowed to remain in the porous dielectric substrate 3.

If the porous dielectric substrate-forming material is the aerogel solution, a primary formed body is prepared by the following procedure: net sheets are each placed on the corresponding flat faces S of the first and second support plates 1A and 1B; the first and second patterned electrodes 2A and 2B are formed on the net sheets on the first and second support plates 1A and 1B, respectively; the first and second support plates 1A and 1B are spaced from each other such that the flat faces S of the first and second support plates 1A and 1B are opposed to each other; the aerogel solution is packed in the space between the first and second support plates 1A and 1B and then dried; the first and second support plates 1A and 1B are removed from the net sheets, whereby the primary formed body having the net sheets arranged on both faces thereof is obtained. The primary formed body is subjected to supercritical extraction, whereby the pore-forming component is extracted and removed from the primary formed body. The productivity of this procedure is high because the efficiency of the supercritical extraction is high.

What is claimed is:

1. A method for manufacturing a porous dielectric substrate including patterned electrodes, comprising:
    a patterned electrode-forming step of preparing two support plates each having corresponding releasable flat faces and then forming the patterned electrodes on the flat faces;
    a spacing step of spacing the two support plates apart from each other such that the flat faces having the patterned electrodes thereon are opposed to each other;
    a porous dielectric substrate-forming step of packing a material for forming the porous dielectric substrate between the spaced support plates to form the porous dielectric substrate in which the patterned electrodes are embedded; and
    a separation step of separating the support plates from the porous dielectric substrate having the patterned electrodes embedded therein.

2. The method according to claim 1, wherein after the patterned electrodes are formed on the flat faces, the patterned electrodes are processed to have rough surfaces in the patterned electrode-forming step.

3. The method according to claim 1, wherein after the flat faces are coated with a releasing agent, the patterned electrodes are formed on the resulting flat faces in the patterned electrode-forming step.

* * * * *